United States Patent [19]

Larson et al.

[11] 4,403,272
[45] Sep. 6, 1983

[54] MEMBRANE SWITCH INTERCONNECT TAIL AND PRINTED CIRCUIT BOARD CONNECTION

[75] Inventors: Willis A. Larson; David A. Christensen; Anthony J. VanZeeland, all of Crystal Lake, Ill.

[73] Assignee: Oak Industries Inc., Rancho Bernardo, Calif.

[21] Appl. No.: 155,562

[22] Filed: Jun. 2, 1980

[51] Int. Cl.³ .............................................. H05K 1/00
[52] U.S. Cl. .................................. 361/398; 339/17 F
[58] Field of Search ................ 200/5 R, 5 A, 159 B, 200/284; 361/398, 402, 413; 339/17 F, 61 M; 174/94 R

[56] References Cited

U.S. PATENT DOCUMENTS

| 3,763,307 | 10/1973 | Wolf | 339/17 F X |
| 4,035,593 | 7/1977 | Riniker | 200/5 A |
| 4,054,348 | 10/1977 | Stroupe et al. | 339/17 F X |
| 4,065,649 | 12/1977 | Carter et al. | 200/5 A |
| 4,128,744 | 12/1978 | Seeger | 200/5 A |
| 4,180,711 | 12/1979 | Hirata et al. | 361/398 X |
| 4,217,473 | 8/1980 | Parkinson | 200/159 B |

Primary Examiner—J. R. Scott
Attorney, Agent, or Firm—Kinzer, Plyer, Dorn & McEachran

[57] ABSTRACT

A switching device, for example a membrane switch, having an interconnect tail for electrically connecting the switching device to a circuit board. The tail has conductive traces formed thereon, which are in circuit with the conductive elements of the switching device. The conductive traces on the tail are raised from the plane of the tail thus making the traces the most prominent part of the tail. This structure assures electrical contact with the circuit board.

6 Claims, 11 Drawing Figures

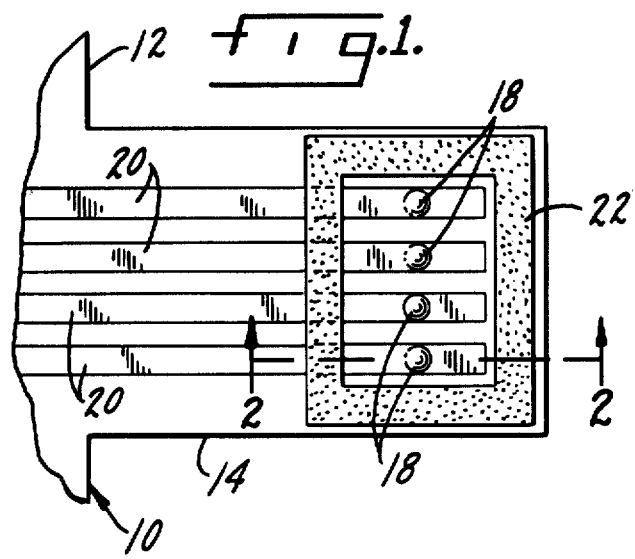
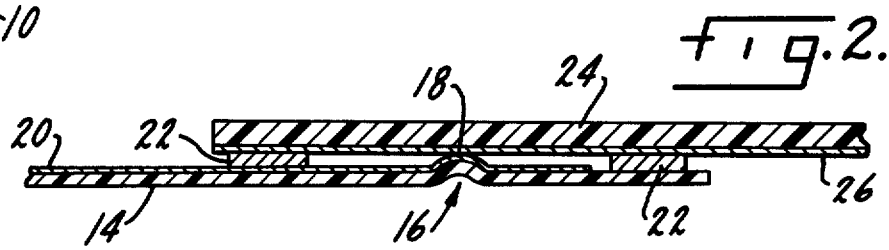
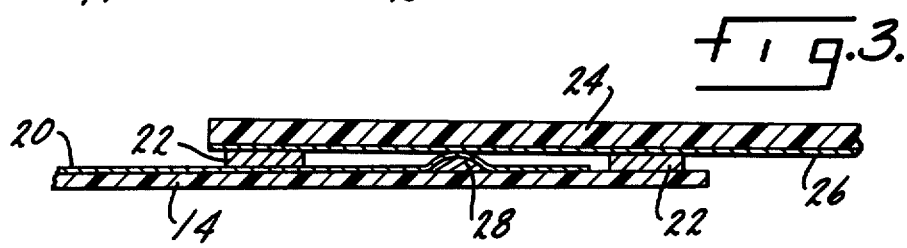
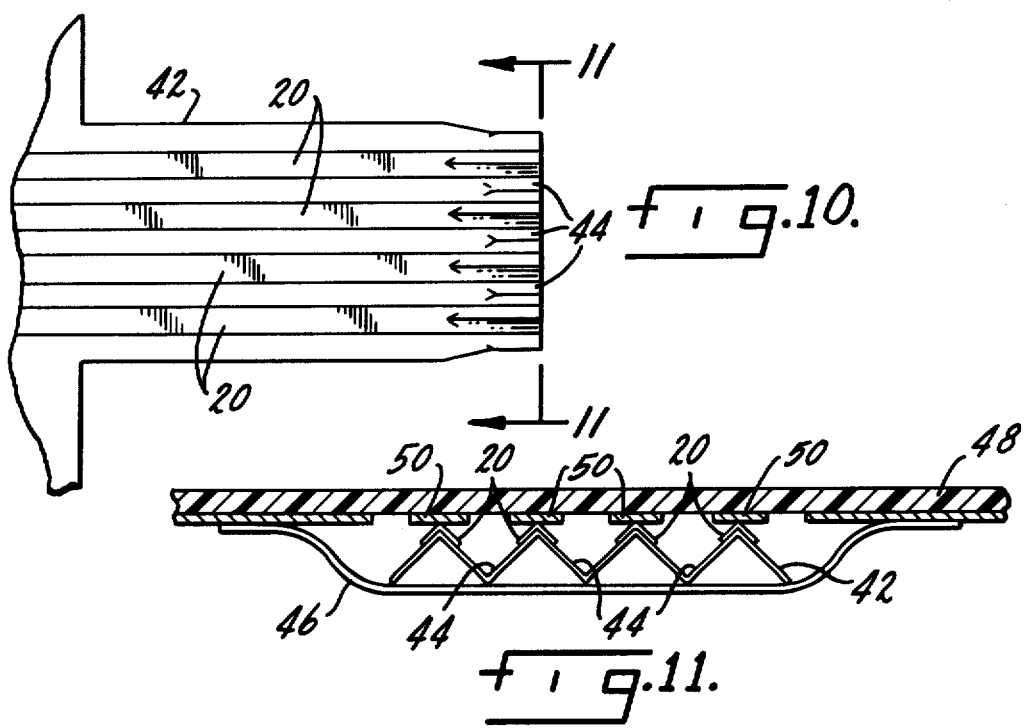

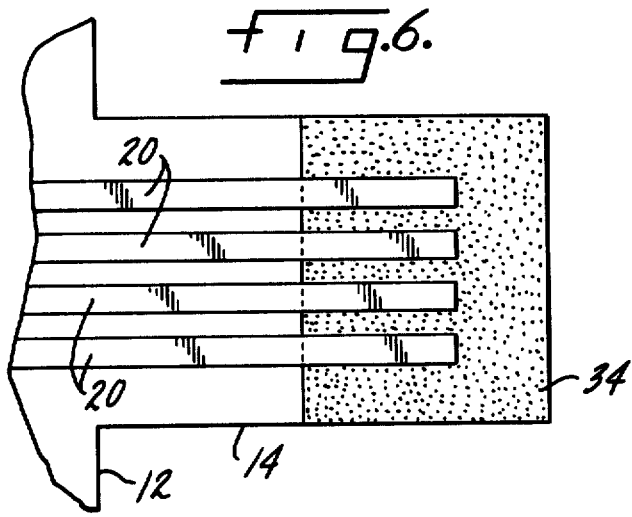
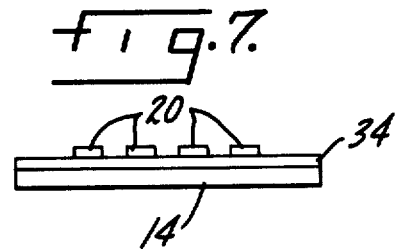
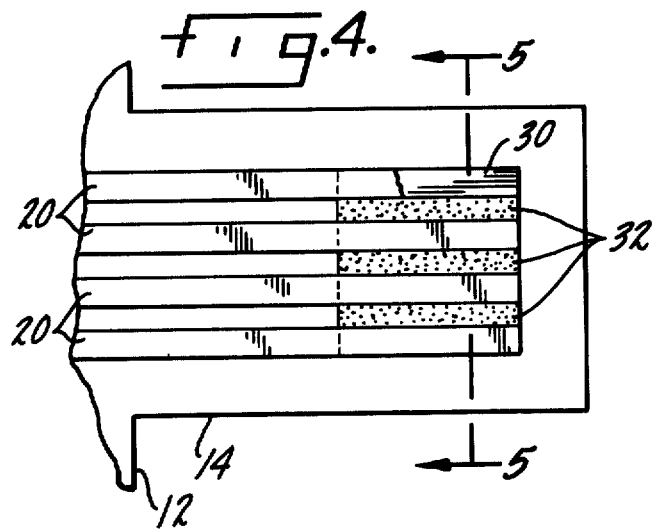
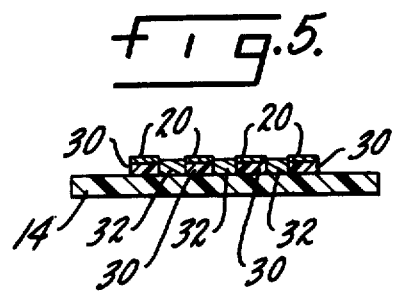
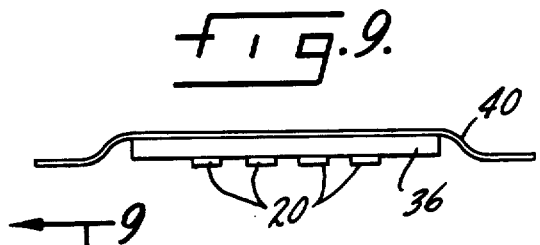
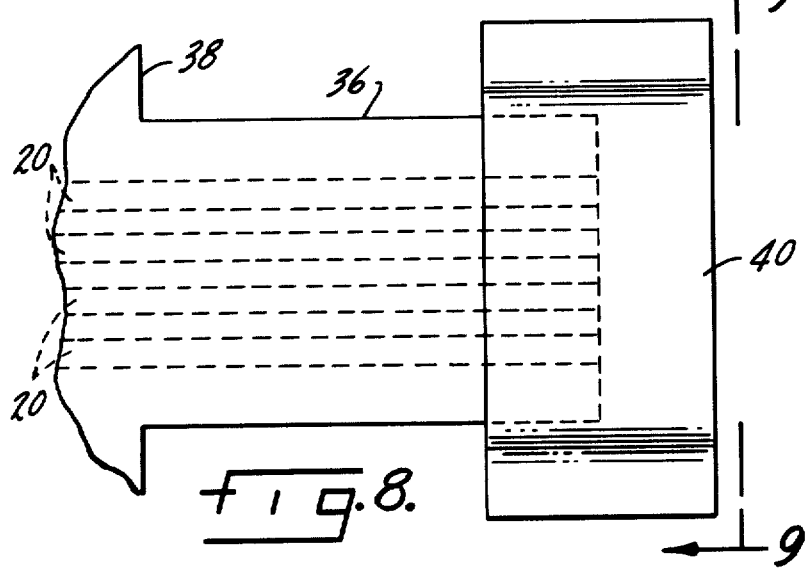

MEMBRANE SWITCH INTERCONNECT TAIL AND PRINTED CIRCUIT BOARD CONNECTION

SUMMARY OF THE INVENTION

This invention relates to switching devices and more particularly to a structure for electrically connecting such devices to other electrical equipment.

A primary object of the present invention is an inexpensive, reliable interconnect structure for switching devices.

Another object is an interconnect structure or tail having self-contained adhesive material for securing the tail to a circuit board.

Another object is an interconnect tail wherein all the parts of the tail can be applied in liquid form.

Another object is a connecting tail of the type described which may include a piece of adhesive tape for securing the tail to a circuit board.

Other objects will appear in the ensuing specification, drawings and claims.

BRIEF DESCRIPTION OF THE DRAWINGS

The invention is illustrated diagrammatically in the following drawings wherein:

FIG. 1 is a top plan view of a portion of a membrane switch and its connecting tail, FIG. 2 is a section taken generally along line 2—2 of FIG. 1, FIG. 3 is a view similar to FIG. 2, showing an alternate form, FIG. 4 is a top plan view of an alternate embodiment of a membrane switch and connecting tail according to the present invention, with portions removed for clarity, FIG. 5 is a section taken generally along line 5—5 of FIG. 4, FIG. 6 is a top plan view of a further alternate embodiment, FIG. 7 is an end elevation view of the tail of FIG. 6, FIG. 8 is a top plan view of a further alternate embodiment of the invention, FIG. 9 is an end elevation view taken along line 9—9 of FIG. 8, FIG. 10 is a top plan view of a further alternate embodiment of the present invention, FIG. 11 is an end elevation view taken substantially along line 11—11 of FIG. 10.

DESCRIPTION OF A PREFERRED EMBODIMENT

The present invention concerns keyboards of the type utilizing a membrane switch panel. More specifically, the present invention relates to the connecting tail for use with such a switch panel. The invention is not limited to use with membrane switches, although connecting tails of the type disclosed herein find ready application in such an environment. By connecting tail we refer to that portion of the switch which connects to the auxiliary electrical circuitry and conventionally will extend outwardly from one side or one area of a membrane switch or other type of switch device. However, it is not absolutely required that there be a separately identifiable extension from the main portion of the switch panel. The tail could simply be an area where all the conductors have been congregated for convenient attachment to auxiliary electronics.

Membrane switches of the type described are economically manufactured by applying the conductor elements in liquid form by techniques such as silk screening. Similarly, it is preferable to form the conductive traces on the tail by a silk screening process. The screened conductors, however, are difficult to connect to auxiliary electronics because the conductors are very thin, on the order of a few thousandths of an inch. When a tail is attached to a printed circuit board, any unevenness in the contact between the tail and the board can result in a conductor trace being out of contact with the board. The present invention solves this difficulty by providing a connecting tail wherein the conductor traces are the most prominent part of the tail. That is, the traces are upraised from the normal plane of the tail so the traces are the first element in contact with the circuit board. This assures electrical contact.

FIGS. 1 and 2 show a first embodiment of a connecting tail according to the present invention. A portion of the membrane switch is shown generally at 10. While not all parts of the switch have been shown, it will be understood that the switch will comprise a substrate layer and a membrane layer with a plurality of conductive elements formed on each of the layers. The layers are conventionally separated by a spacer (not shown). The conductive elements are arranged into a pattern forming switch sites or locations. A particular switch is closed by applying pressure to the membrane at the switch location. The embodiment shown includes a substrate layer 12 and a connecting tail 14 attached to the substrate layer. The tail includes an upraised portion shown generally at 16 in FIG. 2. The upraised portion 16 in this embodiment comprises a plurality of individual bumps 18. The bumps 18 may be formed by embossing them in the tail material. Spaced conductive traces 20 are formed on the tail and are arranged such that the traces cross the upraised portion 16. Thus the traces are raised above the general plane of the tail at the point where they cross the upraised portion. A pattern of adhesive material 22 is applied to the tail for purposes of securing it to the auxiliary electronics. Typically, the tail will connect to a circuit board 24 which has conductors 26 designed to connect with the traces 20 on the tail. A preferred configuration of the adhesive material is the frame arrangement shown in FIG. 1. The frame surrounds the upraised portion 16.

Looking at FIG. 2, it will be noted that where the trace 20 crosses the upraised portion 16 the trace protrudes from the tail at least as much as the adhesive material 22. This assures that the trace 20 will make contact with the conductor 26 on the circuit board 24.

FIG. 3 shows an alternate form for the upraised portion of the tail. There the upraised portion comprises a bump 28 formed by applying insulative paint which is of course dried before the application of the traces 20. The thickness of the paint bump 28 is at least as great as the thickness of the adhesive material 22.

The upraised portion has been shown as a plurality of individual bumps, with one bump for each conductive trace. It will be noted that other forms could be used for the upraised portion. For example a continuous ridge, either embossed or painted on the tail, could be used. Likewise the pattern of adhesive material 22 need not be limited to the frame configuration shown.

FIGS. 4 and 5 illustrate an example of a further alternate embodiment of this invention. There the upraised portion comprises a bar 30 of insulative paint under each trace 20. A pattern of adhesive material, applied for example by screen printing, takes the form of adhesive strips 32 between the traces 20. The adhesive strips 32 may terminate at the same point as the bars 30, or they may extend beyond the bars toward the substrate 12. The upraised bars 30 make up what would otherwise be a height difference between the traces 20 and the adhesive stripes 32. Where the traces are on top of the bars they are slightly above the level of the adhesive stripes.

FIGS. 6 and 7 illustrate a further form of the present invention. In this arrangement a coating 34 of adhesive material is applied directly to the tail 14. The conductive traces 20 are applied over the adhesive coating. The traces are applied by transfer techniques such as a pad printer. Since the traces are on top of the adhesive coating, no separate upraised portion is required. The traces are already on top of the adhesive material and thus connection to the circuit board is assured.

FIGS. 8 and 9 show a tail 36 connected to a membrane layer 38 of a switch device. The conductive traces 20 are formed directly on the underside of the tail 36. The tail is attached to a circuit board by a piece of adhesive tape 40. The tape is applied to the side of the tail opposite that of the conductive traces 20. Thus no adhesive will interfere with the connection of the traces to the conductors on a circuit board.

Still another form of connecting tail is shown in FIGS. 10 and 11. Here the tail 42 has traces 20 formed thereon. A series of depressions 44 are formed at the end of the tail, between traces 20. As shown in FIG. 11, the depressions 44 comprise V-shaped depressions folded in the end of the tail. This gives the tail a fan-like configuration. The traces 20 are located at the apex of the tail formed by the junction of the V-shaped folds. This makes the traces the most prominent part of the tail. When the tail is attached by adhesive tape 46 to a circuit board 48 contact is assured between the traces 20 and conductors 50 on the circuit board.

It can be seen that in all the embodiments of the connecting tail, the conductive traces of the tail are placed in a prominent location. By prominent it is meant that the traces are struck up at some point so as to render them the first element to contact a mating, generally planar surface. This assures that electrical contact will be made and maintained between the tail and a circuit board, despite any unevenness in either of the two mating parts.

Whereas several preferred forms of the present invention have been shown and described, it will be realized that additional modifications may be made thereto without departting from the spirit and scope of the invention.

We claim:

1. Means for interconnecting electrical conductors useful in membrane switch technology including a tail element, conductive trace means formed on said tail elements, adhesive means for securing said tail element to separate electrical means having electrical conductors thereon, said tail element including an upraised portion with the conductive trace means, at least in part, being positioned on said upraised portion, whereby the upraised portion positions the conductive trace means, at least in part, above said adhesive means to insure positive contact between said conductive trace means on the tail element and the electrical conductors on said separate electrical means.

2. The structure of claim 1 wherein the conductive trace means includes a plurality of spaced conductive traces, the upraised portion comprises a plurality of individual bumps, there being one bump for each conductive trace.

3. The structure of claims 1 or 2 wherein the upraised portion is embossed in the tail.

4. The structure of claim 1 or 2 wherein the upraised portion is formed by applying insulative paint in liquid form which is then dried.

5. The structure of claim 1 wherein the adhesive means comprises a frame pattern around the upraised portion.

6. The structure of claim 1 further characterized in that said adhesive means includes a layer of adhesive on said tail element, with said conductive trace means overlying said layer of adhesive.

* * * * *